(12) United States Patent
Zortea et al.

(10) Patent No.: US 9,680,489 B2
(45) Date of Patent: Jun. 13, 2017

(54) BACKGROUND CALIBRATION OF SAMPLER OFFSETS IN ANALOG TO DIGITAL CONVERTERS

(71) Applicant: MULTIPHY LTD., Ness-Ziona (IL)

(72) Inventors: Anthony Eugene Zortea, Pipersville, PA (US); Russell Romano, Allentown, PA (US)

(73) Assignee: MULTIPHY LTD., Ness-Ziona (IL)

( * ) Notice: Subject to any disclaimer, the term of this patent is extended or adjusted under 35 U.S.C. 154(b) by 0 days.

(21) Appl. No.: 15/280,963

(22) Filed: Sep. 29, 2016

(65) Prior Publication Data
US 2017/0099061 A1  Apr. 6, 2017

Related U.S. Application Data

(60) Provisional application No. 62/236,194, filed on Oct. 2, 2015.

(51) Int. Cl.
*H03M 1/10* (2006.01)
*H03M 1/12* (2006.01)

(52) U.S. Cl.
CPC ....... *H03M 1/1023* (2013.01); *H03M 1/1245* (2013.01)

(58) Field of Classification Search
CPC .................................................. H03M 1/1245
USPC ................................ 341/118, 120, 155, 159
See application file for complete search history.

(56) References Cited

U.S. PATENT DOCUMENTS

| 8,749,410 | B1* | 6/2014 | Van Der Goes | H03M 1/1057 341/118 |
| 9,444,480 | B1* | 9/2016 | Zanchi | H03M 1/1009 |
| 2009/0115650 | A1* | 5/2009 | Tietjen | H04B 7/0617 341/141 |
| 2011/0102228 | A1* | 5/2011 | Anthony | H03M 1/0607 341/155 |
| 2012/0075129 | A1* | 3/2012 | Kidambi | H03M 1/1052 341/118 |

* cited by examiner

*Primary Examiner* — Peguy Jean Pierre
(74) *Attorney, Agent, or Firm* — FishBroyles, LLP; Robert Kinberg

(57) ABSTRACT

A method for background calibration of sampler offsets in an Analog to Digital Converter (ADC), according to which one of the samplers of the ADC is established as a reference sampler, whose threshold and timing offsets will be the criterion for adjusting threshold offsets and timing offsets of all other samplers. Then each of the other samplers of the ADC, one at a time, is calibrated by selecting an uncalibrated sampler and establishing it as the current Sampler Under Calibration (SUC); disregarding contribution of the SUC to the output of the ADC; adjusting the threshold of the SUC to be identical to the threshold of the reference sampler; performing one-bit cross-correlation between the reference sampler and the SUC; establishing an error surface representing the threshold offset and timing offset of the SUC with respect to the reference sampler; adjusting the threshold and the timing of the SUC to be equal to the threshold and timing of the reference sampler; restoring level of the SUC to its original threshold with respect to the overall ADC and restoring contribution of the SUC to the output of the ADC.

9 Claims, 7 Drawing Sheets

BACKGROUND CALIBRATION OF SAMPLER OFFSETS IN ANALOG TO DIGITAL CONVERTERS

CROSS-REFERENCE TO RELATED APPLICATION

This application claims the benefit of U.S. Provisional Application No. 62/236,194, filed Oct. 2, 2015, the disclosure of which is incorporated herein by reference in its entirety.

FIELD OF THE INVENTION

The present invention relates to the field of Analog to Digital Converters (ADCs). More particularly, the invention relates to a method for calibrating samplers of ADCs.

BACKGROUND OF THE INVENTION

A flash ADC resolves an analog signal level to a digital number by comparing the analog signal at an instant in time to a set of thresholds. This comparison is performed by a set of analog samplers, which are also called clocked comparators.

The clocked comparator introduces an offset to the desired threshold, in addition to other imperfections. Threshold errors in an ADC introduce distortion in the resolved digital signal and therefore degrade the ADC's signal to noise and distortion ratio (SNDR). In addition, clocked comparators may include timing errors, which contribute to the overall noise and distortion of the ADC.

Sampler offsets may vary in a number of manners, such as:
- differences between samplers;
- differences between dies; and
- differences between temperatures, processes, power supply voltages, which appear over time.

A method for calibrating a sampler by introducing special test signals, known as "foreground calibration", introduces a time when the ADC is not resolving the true input signal, and this is not acceptable for some applications.

Another existing method for calibrating samplers is by using special circuitry, such as Digital to Analog Converters. This solution, however, is expensive in terms of die area and power dissipation.

An alternative method is a onetime calibration (e.g., at power-up) where the calibration scheme does not interfere with the transmission scheme once the latter has begun. This method however is not optimal, since the calibration will degrade over time, which entails SNDR degradation over time, when the errors themselves change over time, due to the fact that temperature or other conditions change.

It would be advantageous to be able to remove ADC sampler offsets without interfering normal data transmission, while maintaining calibration throughout the entire transmission scheme, using an economical system.

It is therefore an object of the present invention to provide a method for calibrating ADC samplers and removing ADC sampler offsets, without interfering data transmission, while maintaining calibration through the entire transmission scheme using an economical system.

Other objects and advantages of this invention will become apparent as the description proceeds.

SUMMARY OF THE INVENTION

The present invention is directed to a method for background calibration of sampler offsets in an Analog to Digital Converter (ADC), comprising the following steps:

a. establishing one of the samplers of the ADC as a reference sampler, whose threshold and timing offsets will be the criterion for adjusting threshold offsets and timing offsets of all other samplers; and
b. calibrating each of the other samplers of the ADC, one at a time, by:
  b.1) selecting an uncalibrated sampler and establishing it as the current Sampler Under Calibration (SUC);
  b.2) disregarding contribution of the SUC to the output of the ADC;
  b.3) adjusting the threshold of the SUC to be identical to the threshold of the reference sampler;
  b.4) performing one-bit cross-correlation between the reference sampler and the SUC;
  b.5) establishing an error surface representing the threshold offset and timing offset of the SUC with respect to the reference sampler;
  b.6) adjusting the threshold and the timing of the SUC to be equal to the threshold and timing of the reference sampler;
  b.7) restoring level of the SUC to its original threshold with respect to the overall ADC;
  b.8) restoring contribution of the SUC to the output of the ADC.

The reference sampler may be a sampler whose threshold is at the middle level of the ADC.

The step of disregarding the contribution of the SUC to the ADC's output may comprise disconnecting the SUC from the thermometric output code of the ADC.

The step of disregarding the contribution of the SUC to the ADC's output may comprise digitally removing the contribution from within the thermometric output code using bubble code removal.

The step of adjusting the threshold and timing of the SUC to be equal to those of the reference sampler may comprise following the gradient descent of the error surface, until the timing and threshold of the SUC equal those of the reference sampler, wherein the outputs of the SUC and the reference sampler are continuously sampled, and the cross-correlation between the two is continuously calculated.

In one aspect, the step of adjusting the threshold and timing of the SUC to be equal to those of the reference sampler comprises:
a. adjusting the threshold of the SUC to be equal to that of the reference sampler; and
b. adjusting the timing of the SUC to be equal to that of the reference sampler, wherein the outputs of the SUC and the reference sampler are continuously sampled, and the cross-correlation between the two is continuously calculated.

In one aspect, the step of adjusting the threshold and timing of the SUC to be equal to those of the reference sampler comprises:
a. establishing a grid of arbitrarily selected points on the error surface;
b. calculating the cross-correlation between each point and the reference sampler; and
c. adjusting the threshold and timing of the SUC to be equal to those of the point that has been found to have the highest cross-correlation with the reference sampler.

In one aspect, each sub-ADC of the TIADC is individually calibrated according to the steps above.

The present invention is also directed to an Analog to Digital Converter (ADC) having background calibration capability of sampler offsets, in which:

a. one of the samplers is established a reference sampler, whose threshold and timing offsets will be a criterion for adjusting threshold offsets and timing offsets of all other samplers; and
b. each of the other samplers are calibrated, one at a time, by:
   b.1) selecting an uncalibrated sampler and establishing it as the current Sampler Under Calibration (SUC);
   b.2) disregarding contribution of the SUC to the output of the ADC;
   b.3) adjusting the threshold of the SUC to be identical to the threshold of the reference sampler;
   b.4) performing one-bit cross-correlation between the reference sampler and the SUC;
   b.5) establishing an error surface representing the threshold offset and timing offset of the SUC with respect to the reference sampler;
   b.6) adjusting the threshold and the timing of the SUC to be equal to the threshold and timing of the reference sampler;
   b.7) restoring level of the SUC to its original threshold with respect to the overall ADC;
   b.8) restoring contribution of the SUC to the output of the ADC.

DETAILED DESCRIPTION OF THE INVENTION

The present invention proposes a method for background calibration of ADC samplers and removing ADC sampler offsets.

FIGS. 1a-1d and FIG. 2 schematically illustrate a process of evaluating an error surface representing the threshold and timing offsets of a sampler, according to an embodiment of the invention. In FIGS. 1a-1d numeric 100 is a representation of 11 samplers in an uncalibrated ADC. The horizontal axis is the time axis, and the vertical axis is the voltage axis, i.e. threshold axis. Samplers are represented in FIGS. 1a-1d as dots. Timing offsets are schematically shown as vertical non-alignment of dots, and threshold offsets are schematically shown as deviation of dots from the vertical axis.

Figure 1A:
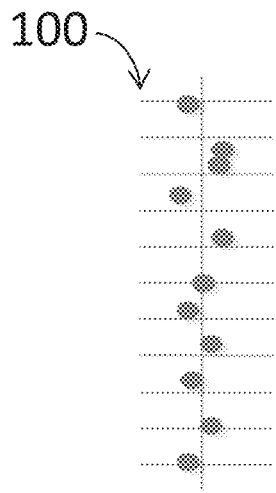
FIG. 1a schematically shows an ADC with 11-samplers, which is to be calibrated, according to an embodiment of the present invention.
Figure 1B:
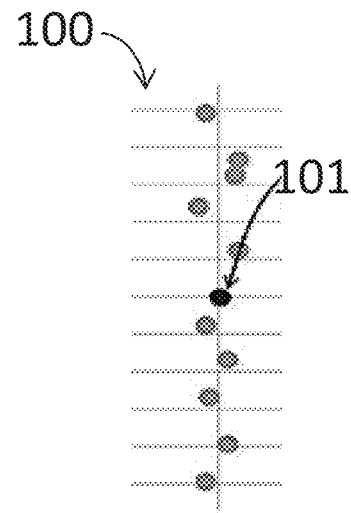
FIG. 1b schematically shows the establishment of a reference sampler for calibration, according to an embodiment of the present invention.

FIG. 1a schematically illustrates an ADC with 11-samplers, which is to be calibrated. According to the invention, one of the 11 samplers of the ADC is established as a reference sampler, numeric 101 in FIG. 1b. According to an embodiment of the invention, the sampler whose threshold is at the middle level of the ADC is determined as the reference sampler.

All other 10 samplers in the ADC will be calibrated with respect to reference sampler 101. After establishing the reference sampler, each of the other samplers undergoes the calibration process described below, one at a time.

Figure 1C:
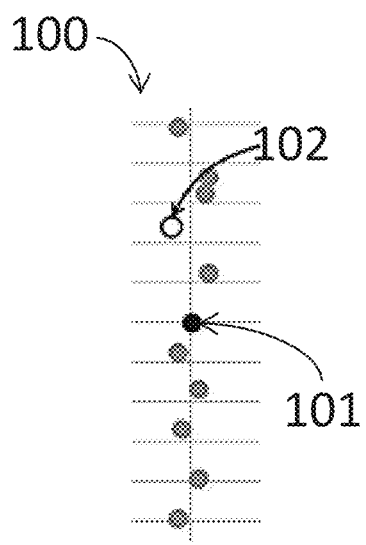
FIG. 1c schematically shows the establishment of a sampler under calibration, according to an embodiment of the present invention.

According to an embodiment of the invention, a first sampler which is to be calibrated, numeric 102 in FIG. 1c, is disconnected from the thermometric output code of the ADC. According to another embodiment of the invention sampler 102 continues to contribute to the thermometric output, although the contribution of 102 will be removed digitally, e.g. by bubble code removal.

Figure 1D:
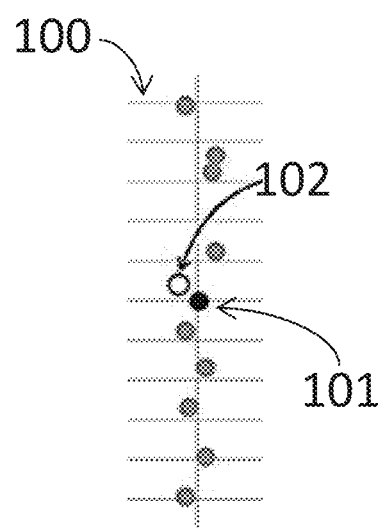
FIG. 1d schematically shows a sampler under calibration whose threshold has been adjusted to be equal to that of a reference sampler, according to an embodiment of the present invention.

Next, as shown in FIG. 1d, the level of sampler 102 is adjusted to be identical to that of reference sampler 101. Once the level is adjusted, one-bit cross-correlation is performed, wherein a series of samples is taken from the outputs of samplers 101 and 102. The samples from 101 are compared to the samples from 102, and an error surface is received, which represents the cross-correlation result.

Figure 2:
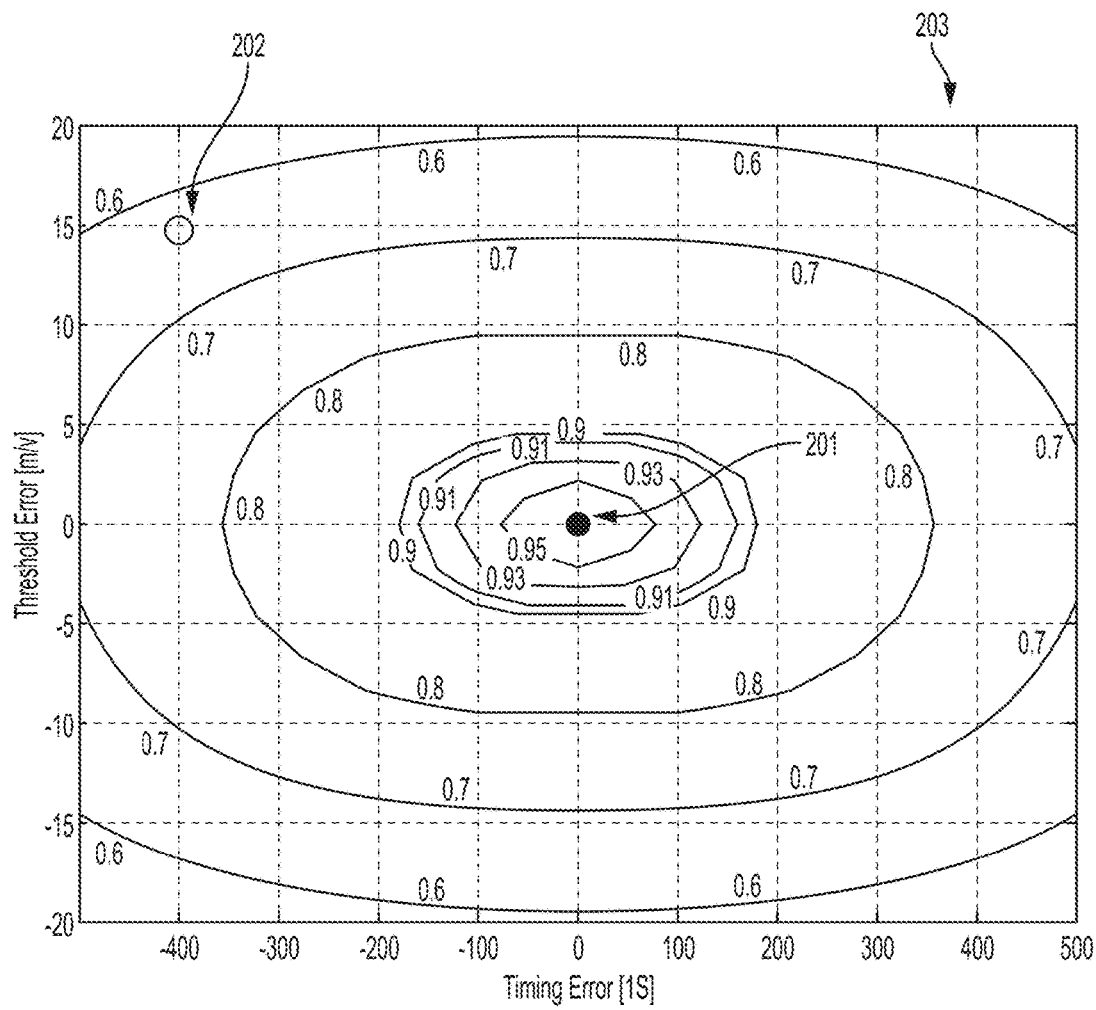
FIG. 2 schematically shows an error surface representing the threshold and timing offsets of a sampler under calibration with respect to a reference sampler, according to an embodiment of the present invention.

FIG. 2 schematically illustrates an error surface 203 representing the threshold and timing offsets of a sampler under calibration (hereinafter SUC), 102, with respect to a reference sampler, 101. The outputs of the reference sampler and the SUC are shown in FIG. 2 as numerical 201 and 202, respectively. The horizontal axis of surface 203 represents the timing of the samples, while the horizontal axis of surface 203 represents the thresholds of the samples.

Once the error surface has been evaluated, the threshold and timing offsets of the SUC are adjusted to equal zero, with respect to the offsets of the reference sampler.

Figure 3A:
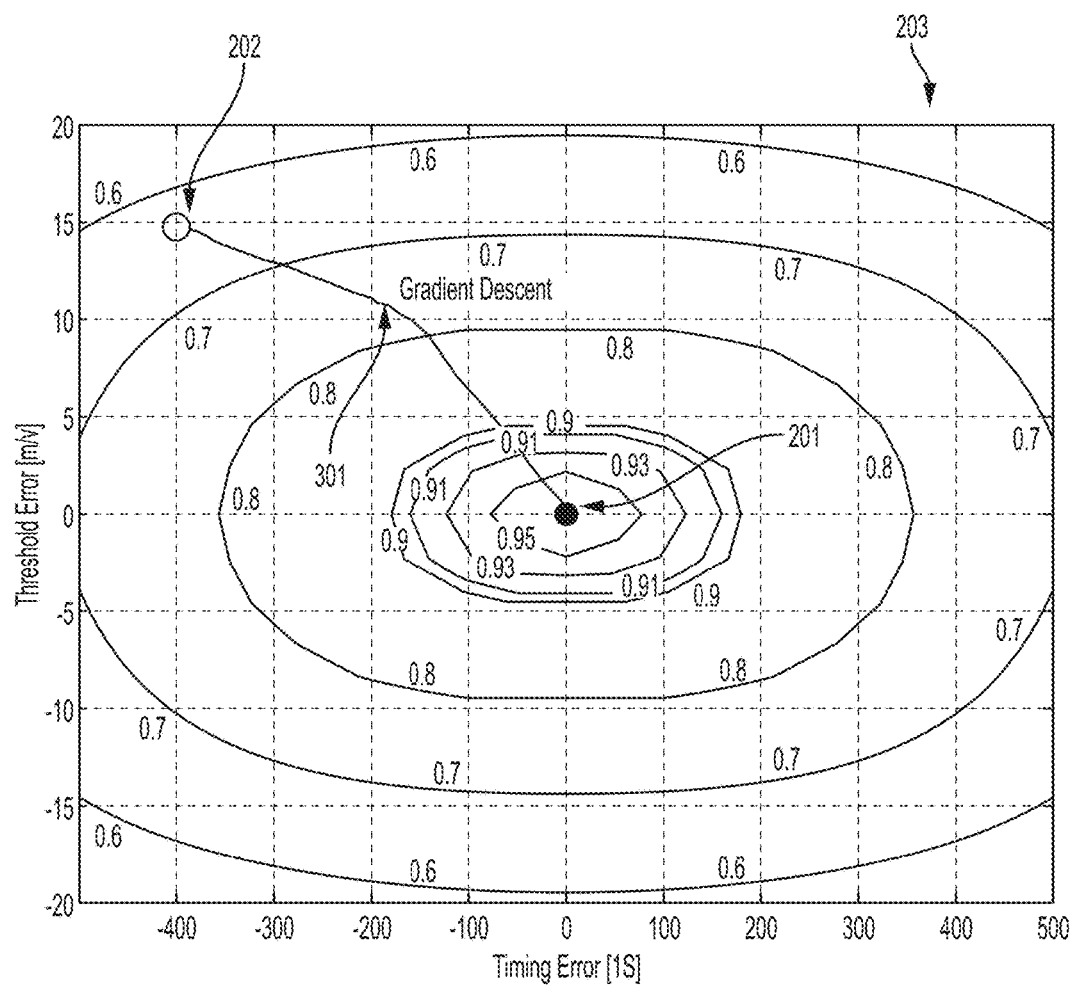
FIGS. 3a-3c schematically show methods of correcting threshold and timing offsets of a sampler under calibration, according to embodiments of the present invention.

FIG. 3a schematically illustrates a method of correcting threshold and timing offsets of a SUC according to an embodiment of the invention. In FIG. 3a the threshold and timing offsets of a SUC are concurrently adjusted by following the gradient descent 301 of the error surface 203, until the timing and threshold of the SUC equal those of the reference sampler. The outputs of the SUC and the reference sampler, i.e. 202 and 201, are continuously sampled during this adjustment, in order to continuously determine the cross-correlation between the two, and to finally decide that they are equal.

Figure 3B:
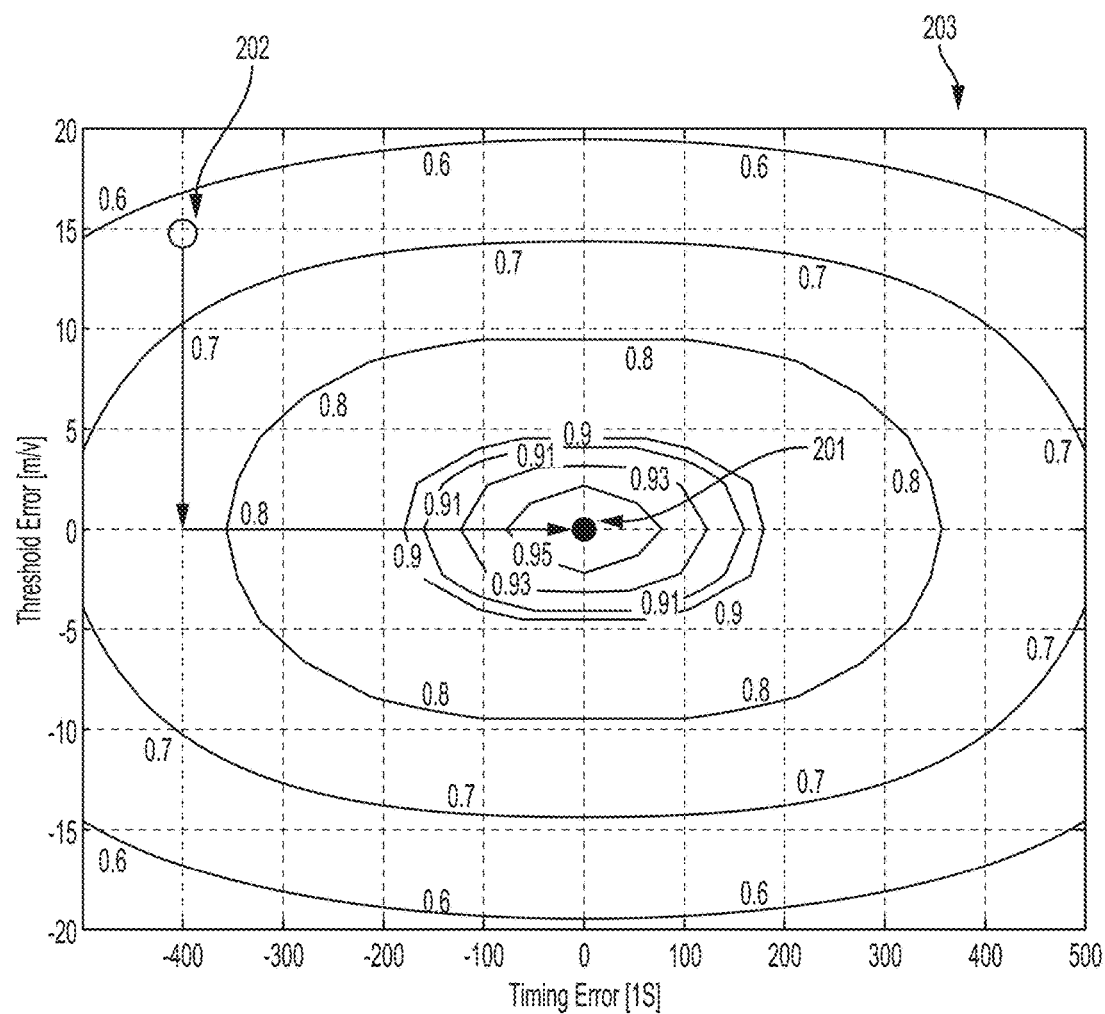

FIG. 3b schematically illustrates another method of correcting threshold and timing offsets of a SUC according another embodiment of the invention. In FIG. 3b the offsets of a SUC are corrected one at a time, i.e. at first the threshold offset is corrected by adjusting the threshold of the SUC until it equals that of the reference sampler. Next, the timing of the SUC is corrected by adjusting it until it is equal to that of the reference sampler. The outputs of the SUC and the reference sampler, i.e. 202 and 201, are continuously sampled during the adjustment, in order to continuously determine the cross-correlation between the two, and to finally decide that they are equal.

Figure 3C:
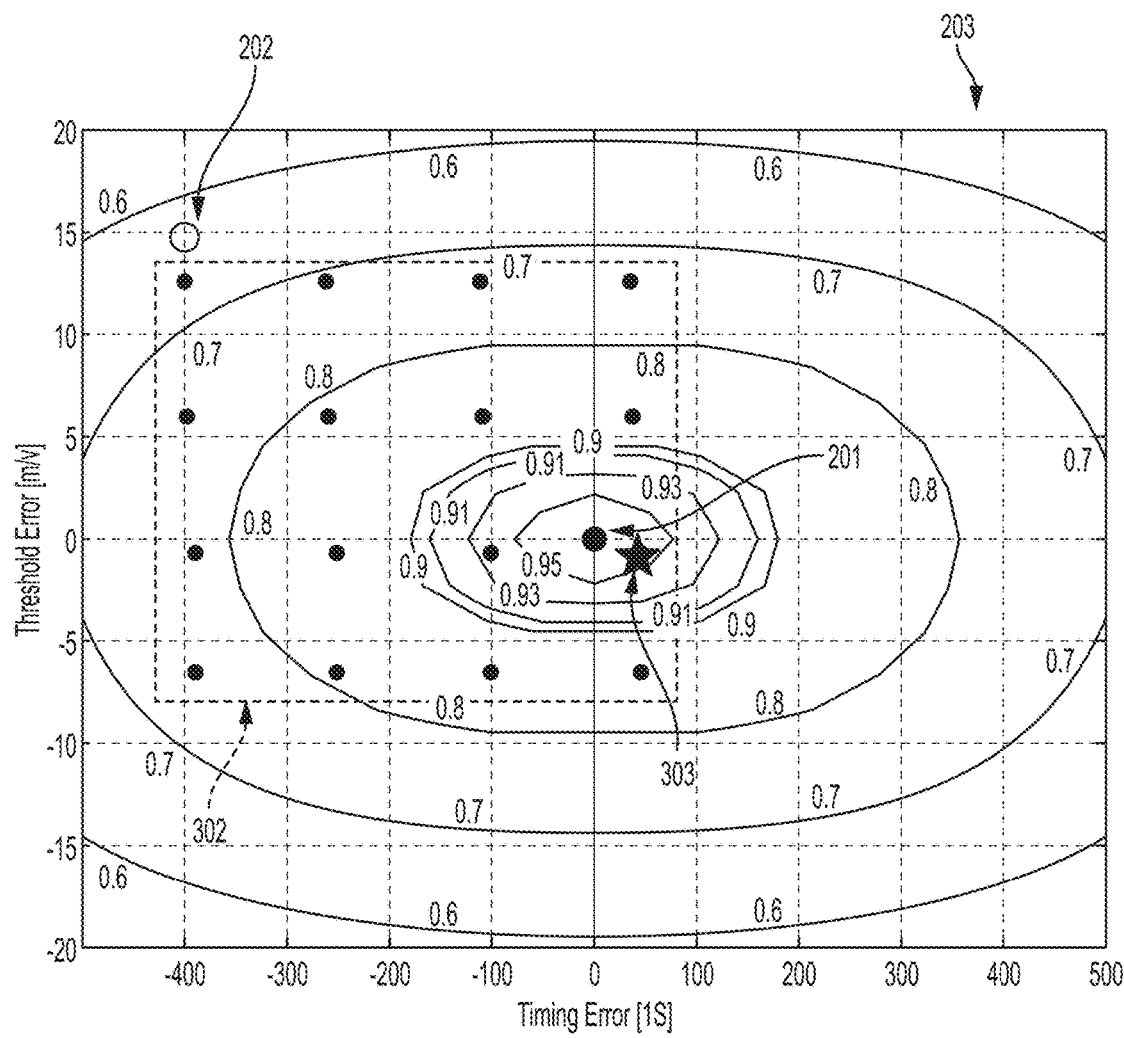

FIG. 3c schematically illustrates yet another method of correcting threshold and timing offsets of a SUC according yet another embodiment of the invention. In FIG. 3c the offsets of a SUC are corrected by establishing a grid 302 of arbitrarily selected points on the error surface 203, calculating the cross-correlation of each point with the output 201 of the reference sampler, and adjusting the offsets of the SUC to be equal to those of the point 303 which has been found to have the highest cross-correlation with the output 201 of the reference sampler.

Figure 4:
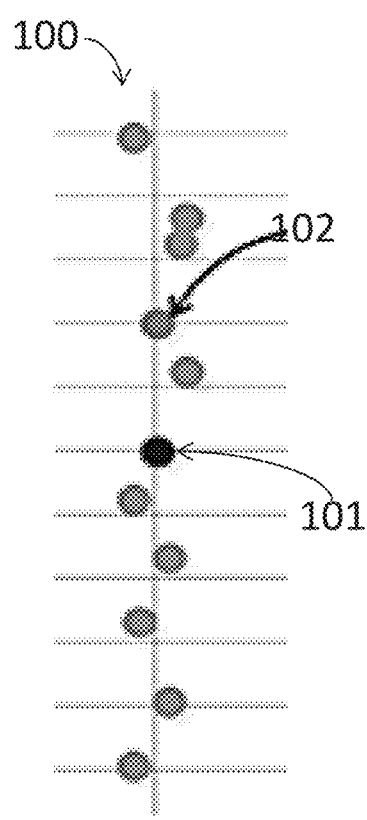
FIG. 4 schematically shows a calibrated sampler returned to its original threshold with respect to the overall ADC, according to embodiments of the present invention.

After adjusting the threshold and timing offsets of a SUC, the level of the SUC is restored, and is returned to its original threshold with respect to the overall ADC, and is now re-connected to the thermometric output code of the ADC. FIG. 4 schematically illustrates the now calibrated sampler 102 returned to its original threshold with respect to the overall ADC 100. It can be seen that the timing and threshold offsets of sampler 102 are equal to those of reference sampler 101.

Figure 5:
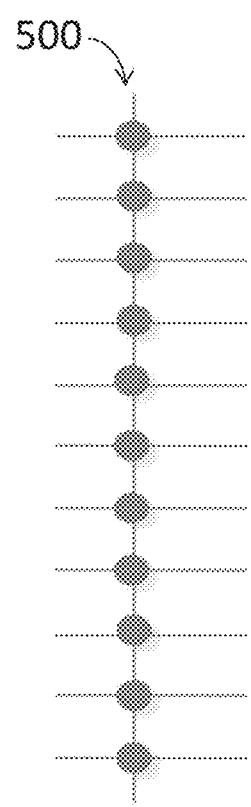
FIG. 5 schematically shows an ADC with 11 samplers which have all undergone calibration, according to embodiments of the present invention.

Next, each of the other nine un-calibrated samplers is calibrated according to the process described above. FIG. 5 schematically illustrates an ADC 500 with 11 samplers which have all undergone calibration.

Figure 6:
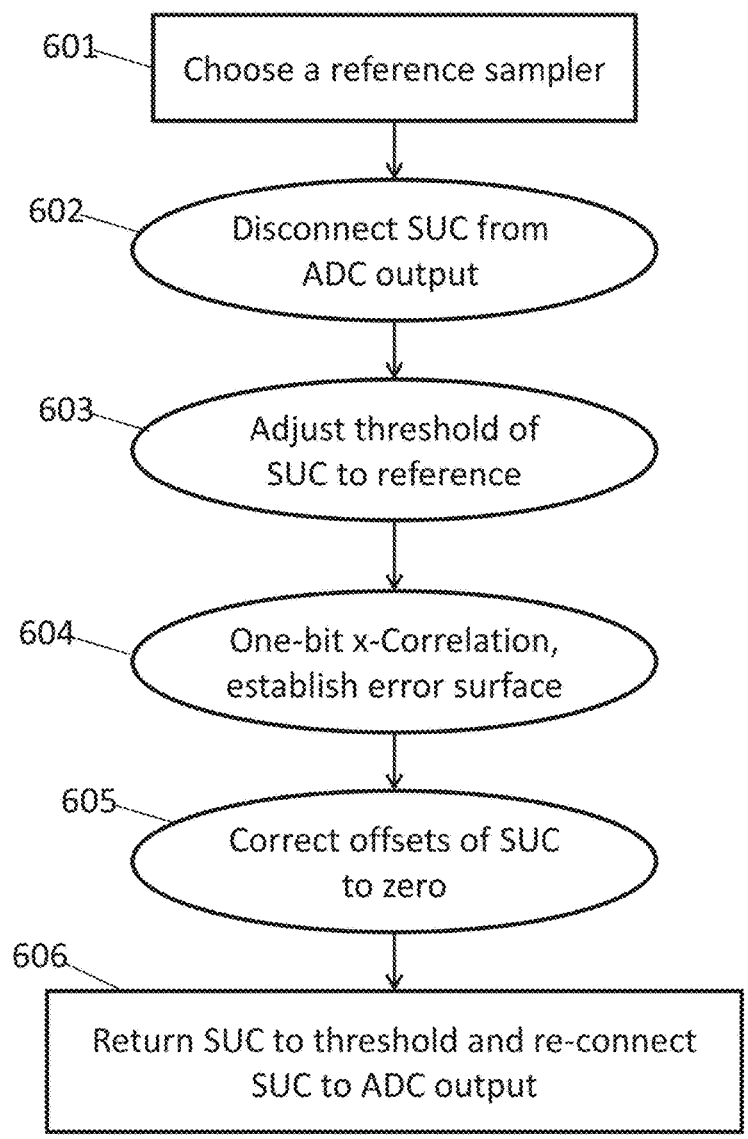
FIG. 6 shows a flowchart which describes the process of calibrating timing and threshold offsets of a sampler under calibration, according to an embodiment of the present invention.

FIG. 6 is a flowchart which describes the process of calibrating timing and threshold offsets of a SUC of an ADC, according to an embodiment of the invention. At the first step 601, a reference sampler is established as a criterion for other samplers. The reference sampler is preferably one of the existing samplers of the ADC, thereby avoiding the need to use a dedicated sampler for this calibration process.

The other samplers will be calibrated with respect to this sampler. At the next step 602, the SUC is disconnected from the thermometric output code of the ADC. At the next step 603, the level of the SUC is adjusted to be identical to that of the reference sampler. At the next step 604, one-bit cross-correlation is performed, and an error surface is established, representing the threshold and timing offsets with respect to the reference sampler. At the next step 605, the threshold and timing offsets of the SUC are corrected to equal the offsets of the reference sampler, according to one of the methods described above. At the next and final step 606, the SUC is restored and returned to its original level with respect to the overall ADC, and is re-connected to the thermometric output code of the ADC. The process has now ended, and the SUC is calibrated.

According to an embodiment of the invention, an ADC is part of a Time Interleaved ADC (TIADC), where a plurality of low frequency sub-ADC's are utilized in order to reach a high frequency ADC. According to this embodiment, a TIADC can be calibrated using the calibration process, by individually carrying out the process for each sampler of each ADC.

As various embodiments have been described and illustrated, it should be understood that variations will be apparent to one skilled in the art without departing from the principles herein. Accordingly, the invention is not to be limited to the specific embodiments described and illustrated in the drawings.

The invention claimed is:

1. A method for background calibration of sampler offsets in an Analog to Digital Converter (ADC), comprising:
   a. establishing one of the samplers of said ADC as a reference sampler, whose threshold and timing offsets will be the criterion for adjusting threshold offsets and timing offsets of all other samplers; and
   b. calibrating each of the other samplers of the ADC, one at a time, by:
      b.1) selecting an uncalibrated sampler and establishing it as the current Sampler Under Calibration (SUC);
      b.2) disregarding contribution of said SUC to the output of the ADC;
      b.3) adjusting the threshold of said SUC to be identical to the threshold of said reference sampler;
      b.4) performing one-bit cross-correlation between said reference sampler and said SUC;
      b.5) establishing an error surface representing the threshold offset and timing offset of said SUC with respect to said reference sampler;
      b.6) adjusting the threshold and the timing of said SUC to be equal to the threshold and timing of said reference sampler;
      b.7) restoring level of said SUC to its original threshold with respect to the overall ADC;
      b.8) restoring contribution of said SUC to the output of the ADC.

2. The method of claim 1, wherein the reference sampler is a sampler whose threshold is at the middle level of the ADC.

3. The method of claim 1, wherein the step of disregarding the contribution of the SUC to the ADC's output comprises disconnecting said SUC from the thermometric output code of said ADC.

4. The method of claim 1, wherein the step of disregarding the contribution of the SUC to the ADC's output comprises digitally removing said contribution from within the thermometric output code using bubble code removal.

5. The method of claim 1, wherein the step of adjusting the threshold and timing of the SUC to be equal to those of the reference sampler comprises following the gradient descent of the error surface, until the timing and threshold of said SUC equal those of said reference sampler, wherein the outputs of said SUC and said reference sampler are continuously sampled, and the cross-correlation between the two is continuously calculated.

6. The method of claim 1, wherein the step of adjusting the threshold and timing of the SUC to be equal to those of the reference sampler comprises:
   a. adjusting the threshold of said SUC to be equal to that of said reference sampler; and
   b. adjusting the timing of said SUC to be equal to that of said reference sampler,
   wherein the outputs of said SUC and said reference sampler are continuously sampled, and the cross-correlation between the two is continuously calculated.

7. The method of claim 1, wherein the step of adjusting the threshold and timing of the SUC to be equal to those of the reference sampler comprises:
   a. establishing a grid of arbitrarily selected points on the error surface;
   b. calculating the cross-correlation between each point and said reference sampler; and
   c. adjusting the threshold and timing of said SUC to be equal to those of the point that has been found to have the highest cross-correlation with said reference sampler.

8. A method for background calibration of Time Interleaved ADCs (TIADC), comprising individually calibrating each sub-ADC that comprise said TIADC according to the method of claim 1.

9. An Analog to Digital Converter (ADC) having background calibration capability of sampler offsets, in which:

a. one of the samplers is established a reference sampler, whose threshold and timing offsets will be a criterion for adjusting threshold offsets and timing offsets of all other samplers; and
b. each of the other samplers are calibrated, one at a time, by:
  b.1) selecting an uncalibrated sampler and establishing it as the current Sampler Under Calibration (SUC);
  b.2) disregarding contribution of said SUC to the output of the ADC;
  b.3) adjusting the threshold of said SUC to be identical to the threshold of said reference sampler;
  b.4) performing one-bit cross-correlation between said reference sampler and said SUC;
  b.5) establishing an error surface representing the threshold offset and timing offset of said SUC with respect to said reference sampler;
  b.6) adjusting the threshold and the timing of said SUC to be equal to the threshold and timing of said reference sampler;
  b.7) restoring level of said SUC to its original threshold with respect to the overall ADC;
  b.8) restoring contribution of said SUC to the output of the ADC.

\* \* \* \* \*